United States Patent [19]

Sebald et al.

[11] Patent Number: 5,234,794

[45] Date of Patent: Aug. 10, 1993

[54] PHOTOSTRUCTURING METHOD

[75] Inventors: Michael Sebald, Hessdorf-Hannberg; Rainer Leuschner, Grossenseebach; Recai Sezi, Roettenbach; Siegfried Birkle, Hoechstadt A/Aisch; Hellmut Ahne, Roettenbach, all of Fed. Rep. of Germany

[73] Assignee: Siemens Aktiengesellschaft, Munich, Fed. Rep. of Germany

[21] Appl. No.: 847,881

[22] Filed: Mar. 10, 1992

Related U.S. Application Data

[63] Continuation of Ser. No. 513,832, Apr. 24, 1990, abandoned.

[30] Foreign Application Priority Data

Apr. 24, 1989 [DE] Fed. Rep. of Germany ....... 3913433

[51] Int. Cl.$^5$ .............................................. G03F 7/40
[52] U.S. Cl. ..................................... 430/325; 430/11; 430/270; 430/312; 430/313; 430/396
[58] Field of Search ............... 430/325, 312, 313, 396, 430/11, 270

[56] References Cited

U.S. PATENT DOCUMENTS

| 4,737,425 | 4/1988 | Lin et al. | 430/325 |
| 4,751,170 | 6/1988 | Mimura et al. | 430/313 |
| 4,945,028 | 7/1990 | Ogawa | 430/325 |

FOREIGN PATENT DOCUMENTS

| 0052806 | 2/1982 | European Pat. Off. . |
| 0130581 | 9/1985 | European Pat. Off. . |
| 2154330 | 9/1985 | United Kingdom ............... 430/189 |

Primary Examiner—Charles L. Bowers, Jr.
Assistant Examiner—Thorl Chea
Attorney, Agent, or Firm—Hill, Steadman & Simpson

[57] ABSTRACT

A simple method for diminishing the trench width in a photoresist structure to below the resolution limit is provided. A photoresist structure is produced and treated with an agent then contains a bulging constituent that reacts with functional groups of the photoresist structure. The bulging constituent causes a volume increase of the photoresist structure. The extent of the volume increase of the photoresist structures is controllable by varying various parameters.

17 Claims, 1 Drawing Sheet

PHOTOSTRUCTURING METHOD

This is a continuation of application Ser. No. 513,832, filed Apr. 24, 1990, now abandoned.

BACKGROUND OF THE INVENTION

The present invention is directed to a method for diminishing the trench width in a photoresist structure to below the resolution limit, as well as, to a photoresist system suitable for this purpose.

In the photolithic production of resist structures, the photolithographic properties of the resist material, the exposure wavelength $\lambda$ employed, and the numerical aperture (NA) of the imaging optics define the resolution limit, i.e., the smallest possible structure (CD) that can be imaged. When both line structures, as well as, trench structures on the mask, can no longer be transferred with sufficient dimensional accuracy into the resist, regardless of their dimension, the resolution limit is surpassed.

As set forth in the following equation, resolution is dependent on a number of physical parameters.

$$CD = k \frac{\lambda}{NA}$$

Pursuant to this equation, resolution can essentially only be enhanced by reducing the exposure wavelength or enlarging the numerical aperture. Factor k is process-associated and system-associated, and only exhibits a slight range of variation given systems that are already optimized.

Typical photoresists that ar presently utilized work with an exposure wavelength in the near ultraviolet range (NUV) at 436 or 365 nm. This allows highly resolved structures in the sub-$\mu$m range (1 through 0.5 $\mu$m) to be achieved. Although there is current development efforts in the area of resists for exposures in deep ultraviolet range (DUV), such a system or product is not yet commercially available.

Currently, only utilizing complicated and expensive methods such as, for example, electron beam or x-ray lithography, can structures in the sub-half $\mu$m range (0.5 through 0.2 $\mu$m) be produced.

The majority of photoresists used for the sub-$\mu$m range function positively. These photoresists are composed of a base polymer and a photo-active component. The photolithographic properties of the resist are characterized by the contrast and by the sensitivity of the material.

Contrast is calculated from the slope of a curve derived from a plot of the chemical erosion of an exposed photoresist layer in the development process versus the logarithm of the corresponding light intensity. A high contrast allows steep edges to be obtained in the photoresist structures at the boundaries between the exposed and unexposed regions of a photoresist layer.

Sensitivity essentially refers to the light sensitivity of a photoresist. It is desirable that sensitivity is enhanced for economic reasons. A higher sensitivity creates a shorter exposure time. Exposure time is the most cost-intensive part of the lithography method.

The photoresist structures are produced on the surfaces of substrates. The surfaces of the substrate can be, for example, semiconductors, ceramic, or metal. The photoresist functions as a mask for the physical or chemical treatment of the substrate surface; the regions that are not covered by the photoresist structure are thereby treated. For example, these regions can have a hole or trench shape.

Due to the miniaturization of microelectronic components, it is necessary to make these resist trenches smaller or narrower. For example, a narrower trench allows the production of a narrower trench cell or a narrower interconnect. In the quest for miniaturization, among the goals is to achieve production-friendly, reproducible, and economical methods, that enhance the resolution limit of the photoresist or to even produce structures that lie beyond the resolution limit of an imaging technique that is used.

Presently, Applicants believe that only two basic methods are currently known for realizing structural dimensions that lie beyond the resolution limit of the lithographic techniques used.

An example of one method is a trench-narrowing technique for an exposure wavelength of 365 nm that is disclosed in a report by Y. Kawamoto et al, "A Half Micron Technology For An Experimental 16 MBIT DRAM Using i-line Stepper", VLSI Symposium, San Diego 1988. The method is based on a three-layer structure wherein the uppermost layer is a top resist. The top resist functions positively. Top resist structures having a width of 0.6 $\mu$m are lithographically produced and are enlarged by plasma deposition of silicon dioxide, or the clearance of the resist trenches is reduced. In a plasma etching process that follows, the resist structures are then transferred onto a spin-on glass intermediate layer lying therebelow. Silicon dioxide spacers thereby only remain at the sidewalls of the photoresist structures. The silicon dioxide spacers reduce the width of the photoresist trenches from an original width of 0.6 $\mu$m to 0.4 $\mu$m. These trenches are transferred into an organic planarization layer lying at the bottom in a further, anisotropic etching process with oxygen plasma.

Utilizing this technique, it is possible, for example, to reduce the memory cell area of an electronic memory module by about 30%, the packing density can thus be correspondingly increased. The method, however, suffers some disadvantages. The disadvantages of the method include the multi-layer structure and the three plasma etching steps required by the method as a result thereof. These steps are complicated to implement and are not particularly production-friendly.

Another method for producing structures below the resolution limit of an optical NUV lithography is described in B. D. Cantos, R. D. Remba, "A Reliable Method For 0.25-Micron Gate MESFET Fabrication Using Optical Photolithography", J. Electrochem. Soc. Acc. Br. Comm., 1311-12 (1988). As set forth therein in a three-layer structure, an image reversal resist is applied as an upper top resist layer and is exposed through a mask. After a tempering step and subsequent flood lighting, resist ridges having a width of 0.25 $\mu$m are obtained in the exposed regions by over-development in an aggressive developer. Structures having a width of 0.65 $\mu$m are prescribed on the mask. An aluminum layer is then vapor-deposited thereon and "developed" in a lift-off process. By lifting the top resist ridges off, along with an aluminum layer lying thereabove, aluminum ridges having a width of 0.25 $\mu$m are obtained in the trenches of the top resist layer. The transfer of this aluminum structure onto an organic planarization layer lying therebelow, together with an insulating intermediate layer, proceeds in an oxygen plasma.

This method also has some disadvantages. Due to the several individual process steps required by the process, the method provides little process tolerance and, thus, is not very production-friendly. Moreover, trench structures only down to a width of 0.25 μm can be obtained through the process.

SUMMARY OF THE INVENTION

The present invention provides a method for the miniaturization of resist trenches that, given an arbitrarily established exposure wavelength, can be implemented with few and simple process steps in a production-friendly and reproducible manner.

To this end, a method for diminishing the trench width in a photoresist structure to below the resolution limit is provided comprising the steps of: applying a photoresist onto a substrate, exposing and developing the photoresist, the photoresist structure that arises includes functional groups that are suitable for chemically bonding with a further compound; treating the photoresist structure with a bulging agent, wherein a bulging constituent contained in the bulging agent bonds with the functional groups in the photoresist structure resulting in an increase in the volume of the photoresist structure; and the degree of the lateral broadening of the resist structures caused by the volume increase is in the range of from a few nannometers to a few micrometers.

In an embodiment, the bulging constituent is present in an aqueous solution, emulsion, or composition containing water.

In an embodiment, the bulging agent is utilized in a vapor phase.

In an embodiment, the bulging constituent is hydrolysis-stable and is utilized in an aqueous-alcohol solution.

In an embodiment, treatment with the bulging agent is carried out at ambient pressure and temperature.

In an embodiment, a flood lighting of the photoresist structure is performed before treatment with the agent.

In an embodiment, the bulging constituent is selected such that the photoresist structure is designationally improved in terms of its physical/chemical properties simultaneously with the treatment with the bulging agent.

In an embodiment, the etching resist of the photoresist structure is intensified.

In an embodiment, the etching resistance to an oxygen-containing etching plasma is intensified with a silicon-containing bulging constituent.

In an embodiment, a bulging constituent including aromatic groups is used for intensifying the etching resistance to a halogen-containing plasma.

In an embodiment, the bulging is performed with a bulging constituent that cross-links with the photoresist structure in order to enhance the thermal/mechanical loadability of the photoresist structure.

In an embodiment the extent of the bulging of the photoresist structure is controlled via the duration of the treatment. In another embodiment, the bulging is controlled via the concentration of the bulging constituent. In another embodiment, the extent of the bulging is controlled via the temperature.

In a further embodiment, a method is provided for lithographically producing structures having a trench width that lies below the optical resolution of a given imaging technique. The method includes the steps of: providing a photoresist that, after the structuring, contains at least one reactive group per regularly recurring structure unit, selected from the group comprising anhydride, epoxy, polyurethane, poly(meth)acrylate, polyester, and polyether; and providing a bulging agent for increasing the volume of the photoresist structure with an accompanying, broadening of the lateral structure, a bulging constituent is contained in the bulging agent and has at least one chemical function per molecule that is suitable for reaction with the reactive group of the photoresist.

In an embodiment, the photoresist includes at least one structure chosen from the following group:

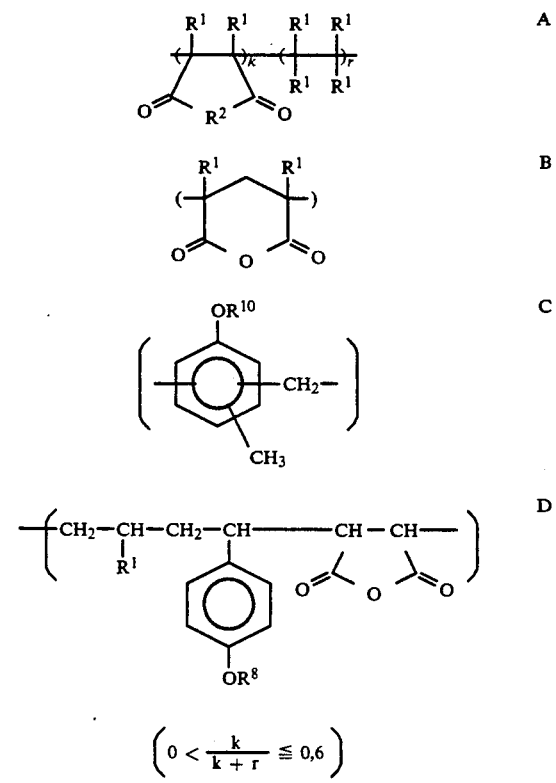

$$\left(0 < \frac{k}{k+r} \leq 0.6\right)$$

or that is derived from polyurethane, poly(meth)acrylate, polyester or polyether.

In an embodiment, the chemical function of the bulging constituent suitable for reaction is a hydroxyl or amino group.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
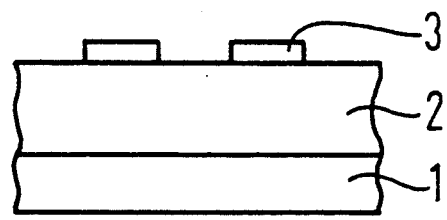
FIG. 1 illustrates a cross-sectional view of a photoresist structure pursuant to a step of the method of the present invention.

The present invention provides a simple, production-friendly method for the miniaturization of resist trenches.

Pursuant to the present invention, a method is provided wherein: a photoresist is applied onto a substrate, exposed and developed, the photoresist structure created includes functional groups that are suitable for chemically bonding with a further compound; the photoresist structure is then treated with a bulging agent, a bulging constituent contained in the bulging agent bonds with the functional groups of the photoresist structure, a resultant volume increase of the photoresist structure is thereby achieved; and the lateral broadening of the resist structures caused by the volume increase varies within a range of from nannometers up to a few micrometers.

In an embodiment, the bulging component is hydrolysis-stable and is utilized in an aqueous-alcohol solution or emulsion. Treatment with the bulging agent can proceed under ambient conditions, i.e., at atmospheric pressure and room temperature.

Because of the bulging agent used, the method of the present invention can be performed as a simple "wet-chemical" process that can, for example, be implemented in an aqueous medium in a simple apparatus. Utilizing the method of the present invention, lithographically produced resist trenches having an arbitrary shape can be constricted to dimensions that lie far beyond the resolution limit of the lithography method used with a simple, chemical widening of adjoining resist ridges. The method allows the production of structures having an arbitrarily small dimension in a substrate. The method of the present invention is not dependent on the type of substrate used, for example, whether the substrate is a semiconductor, an oxide layer, a ceramic, or metal or, given a two-layer technique, is a planarizing bottom resist.

The method of the present invention also allows resist structures produced through NUV photolithography that have a 1:1 ratio of ridge:trench dimensions, to be designationally widened to such an extent that the remaining, constricted resist trenches have lateral dimensions between 0 nm and their original value. For example, 0.5 $\mu$m wide trenches having 0.5 $\mu$m wide ridges can be set to an arbitrary value between 0 and 500 nm. The method allows transistor gates having lengths of between 0 and 500 nm to be simply and reproducible created for the first time via photolithographic methods with a photoresist structure treated in this manner.

Resist depressions that are either round or rectangular can be designationally reduced by the method and still retain their shape. Therefore, for example, via holes or trench cells can be created in nearly any arbitrary dimension.

The method of the present invention is not only independent of the substrate, but is also independent of the exposure wavelength used, as well as of the imaging technique. Moreover, the method is largely independent of the resist used. Further, whether a positive or negative resist is used does not effect the method.

A further advantage of the method of the present invention is that the extent of the widening of the photoresist can be controlled. The extent of the widening of the photoresist can be controlled, for example, by controlling the duration of the treatment of the photoresist structure with the bulging agent. The bulging agent reacts with the photoresist in a steady reaction wherein the bulging component initially diffuses into the photoresist structure in order to ultimately react with the reactive groups present in the photoresist. If the duration of the treatment is extended, the bulging agent can diffuse more deeply into the photoresist structure and thus produce a greater volume increase.

Utilizing a given treatment duration, it is also possible to control the extent of the widening of the photoresist structures by varying the concentration of the bulging constituent in the bulging agent. Pursuant to the laws of reaction kinetics, a higher concentration of a reactant causes a faster reaction. Given a certain reaction duration, by increasing the reaction speed, a higher conversion and, thus, a greater volume increase of the photoresist structures, and thereby a greater constriction of resist trenches, is thereby obtained.

In an embodiment, the bulging constituent is present in a water medium; the medium, for example, can be a solution or emulsion. The bulging constituent may also be present in a purely aqueous medium or an arbitrary solvent mixture that contains water, and may contain alcohol as a further constituent mixable with water. However, other organic solvents are also possible. The bulging constituent and medium can be chosen so that the constituent is soluble in the medium and creates a solution. However, a bulging constituent and medium can be selected wherein the constituent is not soluble in the medium. In such a case, the bulging agent is then, pursuant to the present invention, utilized as an emulsion.

Pursuant to the present invention, in an embodiment, the treatment whereby the photoresist is widened can also be performed utilizing a bulging agent that is present in the vapor phase. When the bulging agent is present in a vapor phase, this provides a convenient control means. To this end, the procedure can be controlled by varying the temperature at which the treatment is performed. Of course, such control means can also be utilized when the bulging agent is in a liquid medium. By increasing the temperature bulging is accelerated.

When the treated photoresist structure is to be used as an etching mask in a later step of the process, then etch-resistant groups can be introduced into the resist simultaneously with the bonding of the bulging constituent to the photoresist structure. In this regard, aromatic groups will exhibit an increased etching resistance to an etching plasma that contains a halogen. On the other hand, however, a photoresist that comprises aromatic structures is not suited for a photostructuring with deep ultraviolet light since the aromatic structures absorb light more intensely in this wavelength range. For use in deep ultraviolet light, a photoresist that is appropriately transparent for deep ultraviolet can thus be used for the photostructuring and can be later made etching-resistant through the method of the present invention.

It is also possible to introduce groups that are resistant to other etching processes. For example, a silicon-containing bulging agent or a silicon-containing bulging constituent can produce or intensify etching resistance to an etching plasma that contains oxygen.

Oxides having a low volatility are formed from the silicon-containing groups in an oxygen plasma. These groups prevent a further oxidation and erosion of resist regions lying therebelow that follow thereupon. Other elements, in addition to silicon, can intensify etching resistance in the oxygen plasma to the extent they form non-volatile oxides in oxygen plasma. An example of such a substance is tin.

Utilizing a silicon-containing bulging constituent, it is also advantageous when Si—O structures are preformed in the silicon-containing bulging constituent. These facilitate a direct conversion into silicon dioxide.

When converted into silicon dioxide fewer silicon organic compounds that are volatile in oxygen plasma are created.

A reaction of only one functional group of a bulging constituent with one reactive group of the photoresist will result in a linking, or bonding, of the photoresist and bulging constituent. An even better bonding of the bulging constituent to the resist structure can be achieved, however, when the bulging constituent includes at least two functional groups. With at least two functional groups, the bulging constituent is not only loosely bonded, but a cross-linking of the resist structure on the basis of a "two point fastening" is achieved. The cross-linking is stronger and can, on the one hand, further increase the etching resistance.

On the other hand, however, the cross-linking can also improve physical properties of the resist structures in a desired way. A cross-linked resist becomes harder and has a higher melting point (or softening or flow point). Raising the softening or flow point of the photoresist is of significance for the use of a resist structure as a mask for further structuring processes. If, during the structuring process, temperatures are elevated, and the flow point of the resist structure is too low, then the resist structures can flow during this process preventing a dimensionally accurate structural transfer. The ability to raise the flow point of the photoresist structure is therefore always advantageous.

The silicon-containing bulging constituents also preferably carry a plurality of functional groups. The functional groups prevent the linking, or bonding, of the bulging constituent to the resist from being undone by the oxidation process in the oxygen plasma before the silicon-containing radical is converted into non-volatile silicon oxide. Every further functional group, or further link location of the bulging constituent to the resist structure, reduces the volatility of oxidation products in the oxygen plasma.

Further requirements of the bulging constituent relate to the solubility of the constituent. First, the bulging constituent should either be easily soluble or at least easily emulsifiable in the medium to be used with the bulging agent. Additionally, however, the solubility of the treated resist structure should not be increased. Therefore, there must be a compromise between the solubility of the agent and the properties of the treated resist structure (insolubility). It should be noted that these demands are eliminated given a chemical treatment in the vapor phase.

It has been found that the size and molecular weight of the bulging constituent can be arbitrarily chosen, but should have an upper limit. The larger and heavier the bulging constituent, the more difficult the diffusion of the constituent into the resist structure. In this regard, it should be noted that a good diffusion capability of the bulging constituent is necessary in order to achieve an adequate degree of widening of the resist structure due to treatment with the bulging agent. The greater the diffusion of the bulging constituent into the resist, the more functional groups are available for reaction with the resist structure and the widening that can be achieved is greater. It is possible to enhance, chemically, the diffusion capability of the bulging constituent into the resist structure when the chemical potential gradient of the bulging constituent in the bulging agent to the resist structure is increased.

With respect to the photoresist, the requirements of the resist that is used in the method of the present invention include good structurability at a given exposure wavelength, the presence of reactive groups after the development for reaction with the bulging constituent, and an insolubility of developed resist structures in the agent or its medium.

It has been found that anhydride groups, particularly the cyclic anhydride groups, function especially well as functional groups in the photoresist. Such a photoresist does not have an increased absorption in the deep ultraviolet (DUV, wavelength below 300 nm), this being absolutely required for a high-resolution structuring. Furthermore, the thermic-mechanical properties of anhydrides, particularly their high glass-transition temperatures, are well-suited for use as photoresists. Using anhydride-containing photoresists, high contrasts, given good resolution, can be achieved with standard photo-active components. This can be attributed to the great polarity difference that occurs between exposed and non-exposed regions during the development. Particularly in positive resists, the hydrophilization of the exposed regions of the photoresist, effected by the decomposition of the photo-active constituent, is intensified by a suitable development process.

If the developer contains amino groups, the anhydride function is hydrolyzed and the stripping of exposed regions is thus intensified or, respectively, improved in the development process. Since the anhydride function of unexposed regions (given positive resists) remains unhydrolized during the development process, it is also well-suited as a functional group for bonding the bulging constituent in the method of the present invention. In such a case, the bulging constituent should include at least one amino group as a functional group.

If the photoresist is composed of a base polymer and of a photo-active constituent, the polymers (for the base polymer) should be selected based on the required transparency for the given exposure wavelength or range. It has been found that alternating copolymers of maleic acid anhydride and styrol or, respectively, of maleic acid anhydride and allyl trimethylsilane are particularly suitable for the DUV range. Both polymers have an excellent transparency in the DUV range (for example at 248 nm) and in the NUV range (near ultraviolet range). Moreover, the polymers have a high thermal stability (glass temperature above 160° C.) and excellent lithographic properties in combination with traditional photo-active constituents, preferably with esters of naphthoquinone diazide-4-sulfonic acid, and suitable developers.

Additional polymers that are suitable pursuant to the present invention, can contain other functional groups suitable for the method of the invention. Such polymers include, for example, compounds of the following general structural formulas A–D or can be derived from polyurethane, poly(meth) acrylate, polyester, or polyether,

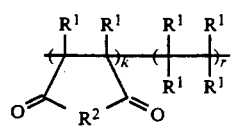

-continued

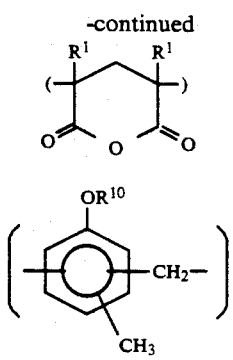   B

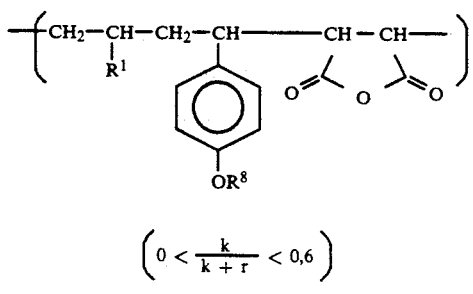   C

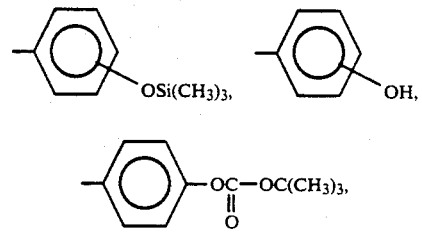   D $$\left(0 < \frac{k}{k+r} < 0,6\right)$$

wherein:

R$^1$ is: H, alkyl, aryl, halogen, halogen-substituted alkyl or, respectively, aryl,

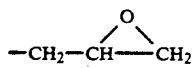

—COOH, —COOR, —CH$_2$Si(CH$_3$)$_3$, —Si(CH$_3$)$_3$, —Si(OCH$_3$)$_3$,

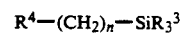

R$^2$ is O, NH, or S;
R$^8$ and R$^9$ are H or CH$_3$; and
R$^{10}$ is H or

As can be derived from the recited structural formulas, anhydride, carboxyl, hydroxyl, and epoxy groups are preferably contained as functional groups for the bonding of the bulging constituent. The base polymers can thereby carry both chemically different, as well as, chemically similar functional groups.

There are a multitude of base polymers suitable for the method of the invention or, respectively, the photoresist employed in the method. Likewise, the selection of the bulging constituents suitable for the bulging process is also extensive.

With respect to the bulging constituents, preferred functional groups that are suitable for reaction with the resist structure or, respectively, with the base polymer of the resist structure, include, for example, aliphatic primary or secondary amino groups. Diamines containing aromatic substances, for example, 1,3-diaminomethyl-benzene and chain-shaped dimethylsiloxanes having terminal aminopropyl units and 1 to 50, preferably 2 to 12, silicon atoms per molecule have been found to function especially satisfactorily. Such bulging constituents can include, for example, the general structural formulas G and H set forth below:

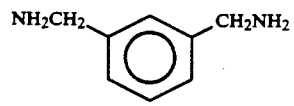   G

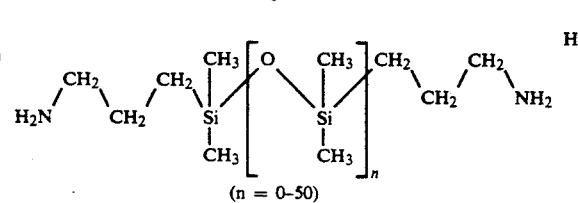   H (n = 0–50)

When a copolymer of maleic acid anhydride and styrol is utilized as the base polymer, then 1,3-diaminomethylbenzene is especially suited as the bulging constituent. Bulging constituents having the general structural formula H, set forth above, are especially suited for widening photoresist structures that contain a copolymer of maleic acid anhydride and allyl trimethylsilane in the resist structure as the base polymer.

Further examples of bulging constituents having amino-functional groups, but also having other functional groups, are represented by the general structural formulas I, K, L and M below:

R$^4$—(CH$_2$)$_n$—SiR$_3^3$   I

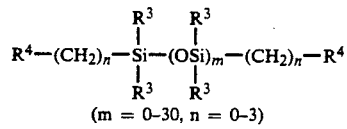   K (m = 0–30, n = 0–3)

(CH$_3$)$_3$Si—NH—Si(CH$_3$)$_3$   L

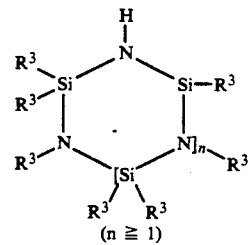   M (n ≥ 1)

wherein:
R$^3$ is H, alkyl, aryl, or cyclo-alkyl; and
R$^4$ is: —OH, —NH$_2$, —SH, —COOH,

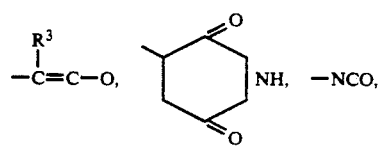

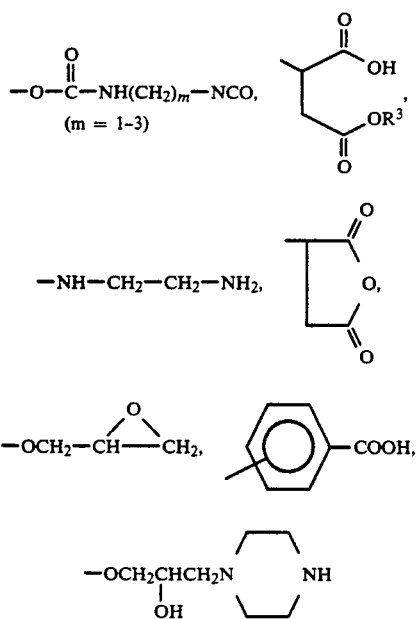

Silsesquioxanes are also suitable as the bulging agent.

As previously stated, the method of the present invention, including the treatment with the bulging agent, can proceed under ambient conditions, i.e., room temperature and ambient pressure. Of course, the process can also proceed at elevated temperatures that are below the deformation temperature of the photoresist structure.

Pursuant to the present invention, a widening of resist ridges or of the general resist structures from a few nannometers up to about a few micrometers can be achieved with the treatment of the bulging constituent. The exact extent of the widening can be defined by controlling the treatment, for example, by setting the temperature. Additionally, a dimensionally true demagnification or, respectively, magnification of the structures can be achieved with the method of the present invention. The resultant widened resist structures can function as an auxiliary mask for further treatments of the substrate, for example, etching of a semiconductor substrate in a halogen plasma. When the widened resist structure is utilized as a top resist over a planarizing bottom resist in a two-layer resist, then the auxiliary structure can be transferred onto the bottom resist in an oxygen plasma.

In a two-layer technique, it is preferred to use a silicon-free top resist in combination with a silicon-containing bulging agent. This arrangement is preferred in order to specifically preserve the etching resistance in the widened areas.

In a single-layer technique, preferably neither the resist nor the bulging agent contains silicon. Instead, a resistance to halogen plasma, that is important for a later etching processes, is produced with a bulging agent that contains aromatic substances.

When the developed resist structures are flood lighted before the widening, then a chemical activation of these structures proceeds due to the photochemical decomposition of the photo-active constituent. This results in a faster and more pronounced widening of the structures.

Due to the widening of resist ridges, one is able to simultaneously constrict resist trenches down to dimensions that are far below the resolution limit of the lithography used. Trenches having an aspect ratio up to about 50 can be produced; previous methods have been unable to achieve such an aspect ratio.

By way of example and not limitation, the present invention shall be set forth in greater detail below with reference to three exemplary embodiments and the figures. Examples 1 and 2 are directed to two uses of the method of the invention for a two-layer technique and contain the compositions for the photoresist and for the bulging agent. Example 3 sets forth the implementation of the method of the present invention for a one-layer technique.

Figure 2:
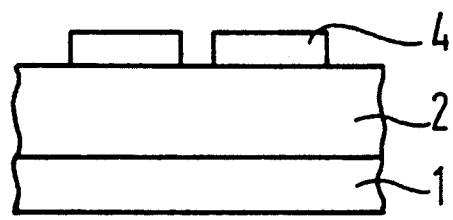
FIG. 2 illustrates a cross-sectional view of the photoresist structure during a further step of the method.
Figure 3:
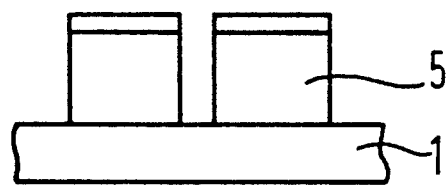
FIG. 3 illustrates a cross-sectional view of the photoresist structure during a further step of the method.

FIGS. 1-3 represent schematic cross-sections through photoresist structures in various stages of the method.

FIRST EXAMPLE

A silicon-containing top resist solution and coating in bilayer technique was produced as follows. The silicon-containing top resist was produced by dissolving sixteen weight parts of a copolymer of allyltrimethylsilane and maleic acid anhydride as a base polymer and four weight parts of a diester of naphthoquinone-diazide-4-sulfonic acid with bisphenol A as a photo-active constituent in eighty weight parts (2-methoxy-1-propyl) acetate as a solvent. The solution was then applied, in a spin-on method on a three-inch silicon wafer that was previously coated with a 1.8 μm thick layer of commercially available photoresist MP 1450 J treated at 210° C. as a planarizing bottom resist. The solution was then applied such that top resist layers were created after drying at 110° C. having a thickness of 0.5 μm.

A silicon-containing bulging agent was produced by mixing eight weight parts of a linear oligo-dimethylsiloxane with terminal amino propyl groups, 80 weight parts isopropanol and 12 weight parts water.

The top resist was structured with following structure-widening and $O_2RIE$ structure transfer into the bottom resist as follows. Three wafers coated with the bottom resist and the top resist set forth above were contact-exposed with a dose of 90 $mJ/cm^2$ at 365 nm through a mask that has line structures of 2.0 through 0.5 μm (ridge/trench) and were subsequently developed in a mixture of 1 weight part developer AZ 400 K (Hoechst AG), 5 weight parts water and 0.5 weight parts ammonia until the widths of the resist webs, identified by scanning electron microscope images, were 0.1 μm narrower than the ridges prescribed on the mask.

The wafers that were pre-treated in this manner were then dipped into the bulging solution, set forth above, for respectively 20, 40, or 65 seconds, and rinsed for 30 seconds in a mixture of 70 weight parts isopropanol and 30 weight parts water. The wafers were then dried at 110° C. on a hot plate. It was determined, with reference to SEM images, that the widths of the resist ridges increased, respectively, by 0.15, 0.30, and 0.50 μm with increasing treatment duration. The widths of the corresponding trenches were reduced by a corresponding amount. Table 1 sets forth the measured structural widths and ratios of ridge-to-trench dimensions.

The structure transfer of the top resist structures widened in such a fashion into the bottom resist lying therebelow proceeds in a plasma reactor under anisotropic $O_2/RIE$ conditions (6 mTorr $O_2$ gas pressure, 410 V bias). The lateral dimensional loss under these etching conditions amounts to 0.05 μm.

Table 1 sets forth the change of the structural dimensions of ridge/trench patterns after treatment in the bulging agent and O₂RIE structure transfer.

| Mask Ridge/ Trench (μm) | Top Resist Ridge/ Trench (after development) (μm) | Treatment Time in the Bulging Agent(s) | Top Resist Ridge/ Trench (after treatment) (μm) | Bottom resist Ridge/ Trench (after O₂RIE) (μm) |
| --- | --- | --- | --- | --- |
| 2.00/2.00 | 1.90/2.10 | 20 | 2.05/1.95 | 2.00/2.00 |
| 1.00/1.00 | 0.90/1.10 | 20 | 1.05/0.95 | 1.00/1.00 |
| 0.50/0.50 | 0.40/0.60 | 20 | 0.55/0.45 | 0.50/0.50 |
| 2.00/2.00 | 1.90/2.10 | 40 | 2.20/1.80 | 2.15/1.85 |
| 1.00/1.00 | 0.90/1.10 | 40 | 1.20/0.80 | 1.15/0.85 |
| 0.50/0.50 | 0.40/0.60 | 40 | 0.70/0.30 | 0.65/0.35 |
| 2.00/2.00 | 1.90/2.10 | 65 | 2.40/1.60 | 2.35/1.65 |
| 1.00/1.00 | 0.90/1.10 | 65 | 1.40/0.60 | 1.35/0.65 |
| 0.50/0.50 | 0.40/0.60 | 65 | 0.90/0.10 | 0.85/0.15 |

SECOND EXAMPLE

The top resist was structured with a following structure widening and O₂/RIE structure transfer into the bottom resist as follows. The first example was repeated with the exception that a mask having aperture structures of 2.0 through 0.5 μm diameter and an exposure dose of 110 mJ/cm² were used for structuring the top resist. Development was performed with the developer described above in Example 1 until the diameters of the holes resolved down to 0.5 μm were identified with SEM images to be respectively 0.1 μm greater than the aperture structures prescribed on the mask.

The wafers pre-treated in this fashion were now each respectively dipped for 20, 40, or 65 seconds into the bulging solution described in Example 1 and rinsed for 30 seconds in a mixture of 70 weight parts isopropanol and 30 weight parts water and were dried at 110° C. on a hot plate. It was determined with reference to SEM images that the diameters of the top resist holes had respectively decreased by 0.15, 0.30, and 0.50 μm, respectively, with increasing treatment duration (see Table 2 below). The structure transfer in an oxygen/RIE plasma proceeded as set forth in Example 1.

Table 2 illustrates the structural dimension of the resist structures identified in REM images before and after the widening treatment and also shows the structures of the bottom resist after the structure transfer. The change of the hole diameter after treatment in the bulging agent and O₂/RIE structure transfer as set forth below.

| Mask (μm) | Top Resist After Development (μm) | Treatment Time in the Bulging Agent(s) | Top Resist (after treatment)(μm) | Bottom Resist (After O₂/RIE) (μm) |
| --- | --- | --- | --- | --- |
| 2.00 | 2.10 | 20 | 1.95 | 2.00 |
| 1.00 | 1.10 | 20 | 0.95 | 1.00 |
| 0.50 | 0.60 | 20 | 0.45 | 0.50 |
| 2.00 | 2.10 | 40 | 1.80 | 1.85 |
| 1.00 | 1.10 | 40 | 0.80 | 0.85 |
| 0.50 | 0.60 | 40 | 0.30 | 0.35 |
| 2.00 | 2.10 | 65 | 1.60 | 1.65 |
| 1.00 | 1.10 | 65 | 0.60 | 0.65 |
| 0.50 | 0.60 | 65 | 0.10 | 0.15 |

THIRD EXAMPLE

The production of a photoresist solution for a single-layer technique was as follows. A photoresist solution was produced by dissolving 16 weight parts of an alternating copolymer of styrol and maleic acid anhydride as the base polymer and 4 weight parts of a diester of naphthoquinone diazide-4-sulfonic acid and bisphenol A as the photo-active constituent in 80 weight parts (2-methoxy-1-propyl)-acetate. This was spun onto a 3-inch wafer under such conditions that a resist film having a layer thickness of 1.0 μm was created after drying at 110° C.

A bulging agent that contains aromatic substances was produced as follows. The bulging solution created contains aromatic substances and was produced by dissolving 10 weight parts 1,3-diaminoethylbenzene in 80 weight parts isopropanol and 10 weight parts water.

The photoresist was structured with a following structure widening. To this end, the wafer coated above was contact-exposed with a dose of 100 mJ/cm² at 365 nm through a mask that had line structures from 2.0 through 0.5 μm (ridge/trench). The wafer was subsequently developed with a mixture of 1 weight part developer AZ 400K, 5 weight parts water, and 0.5 weight parts ammonia until the widths of the resist ridges resolved down to 0.5 μm, identified with reference to SEM images, coincided with the ridge prescribed on the mask.

The wafer was then dipped for 60 seconds into the bulging solution produced above, and was rinsed for 30 seconds in a mixture of isopropanol and water and was dried at 110° C. With reference to SEM images, it was determined that the widths of the resist ridges had each increased by 0.3 μm and those of the resist trenches have diminished by 0.3 μm (see Table 3 below).

Table 3 sets forth the change of the structure dimensions of ridge/trench pattern after treatment in the bulging agent.

| | Structural Widths | |
| --- | --- | --- |
| Mask Ridge/Trench (μm) | Resist Ridge/Trench (after development) (μm) | Resist Ridge/Trench (after 60 second treatment in the bulging solution (μm) |
| 2.00/2.00 | 2.00/2.00 | 2.30/1.70 |
| 1.00/1.00 | 1.00/1.00 | 1.30/0.70 |
| 0.50/0.50 | 0.50/0.50 | 0.80/0.20 |

As can be seen, the Widening of the ridges, or the constriction of the trenches, is only dependent on the treatment duration, independent of the ridge/trench dimension. This demonstrates that the method of the present invention can be accurately controlled. This is of great significance for the transfer of a dimensionally true structure.

Referring now to the Figures, with respect to Example 1, there is illustrated a substrate 1 coated with a bottom resist 2. Top resist structures 3, that have already been developed, are located on the substrate 1.

As illustrated in FIG. 2, wider as well as thicker structures 4 are obtained after treatment with the bulging agent. The arrangement is anisotropically etched in an O₂/RIE plasma, whereby &:he bottom resist structures 5, illustrated in FIG. 3, that are covered with the structures for serving as etching mask are obtained. The constricted trench (compared to the mask or, respectively, to the structures 3 illustrated in FIG. 1) between the illustrated structures 5 are steep etched.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for diminishing the width of a trench in a photoresist structure by bulging the photoresist structure, comprising the steps of:
    applying a layer of a photoresist on a substrate, the photoresist comprising a basic polymer and a photoactive constituent, wherein the basic polymer comprises anhydride groups;
    exposing the photoresist layer to ultraviolet radiation;
    developing the photoresist layer in a developing step, the photoresist structure that is thereby created;
    treating the photoresist structure with an agent immediately following the developing step, the agent including a bulging constituent that bonds chemically with the anhydride groups in the photoresist structure and bulges the photoresist structure, and wherein the bulging constituent comprises at least one amino group as a functional group and is present in a medium that includes at least water; and
    whereby the bulging of the photoresist structure causes a diminishing of the trench width in a range from 0.15 through 0.5 μm.

2. The method of claim 1 wherein the bulging constituent is present in an aqueous solution.

3. The method of claim 1 wherein the bulging constituent is present in an emulsion.

4. The method of claim 1 wherein the bulging agent is present in the vapor phase.

5. The method of claim 1 wherein the bulging constituent is hydrolysis-stable and is present in an aqueous-alcohol solution.

6. The method of claim 1 wherein the treatment with the bulging agent is performed at ambient pressure and temperature.

7. The method of claim 1 wherein a flood lighting of the photoresist structure is performed before the treatment with the bulging agent.

8. The method of claim 1 wherein the bulging constituent is selected such that the photoresist structure is designationally improved in terms of its physical and chemical properties simultaneously with the treatment with the bulging constituent.

9. The method of claim 1 wherein an etching resistance of the photoresist structure is intensified when treated with the bulging constituent.

10. The method of claim 1 wherein the etching resistance to an oxygen-containing etching plasma is intensified when treated with the bulging constituent.

11. The method of claim 1 wherein the bulging constituent includes silicon.

12. The method of claim 1 wherein a bulging constituent comprising aromatic groups is used for intensifying the etching resistance to a halogen-containing plasma.

13. The method of claim 1 wherein the bulging constituent includes a structure that cross-links with the photoresist in order to enhance the thermal and mechanical loadability of the photoresist structure.

14. The method of claim 1 wherein the extent of a bulging of the photoresist structure is controlled by the duration of the treatment.

15. The method of claim 1 wherein a bulging of the photoresist structure is controlled by the concentration of the bulging constituent.

16. The method of claim 1 wherein the extent of the bulging of the photoresist structure is controlled by temperature.

17. The method of claim 1 wherein the treatment of the photoresist structure is undertaken in a spray, puddle, or emersion developer.

* * * * *